(12) United States Patent
Nguyen

(10) Patent No.: US 11,956,934 B2
(45) Date of Patent: Apr. 9, 2024

(54) CONDUCTIVE CONCRETE STRUCTURE FOR DOORLESS ACCESS TO ELECTROMAGNETIC SHIELDED STRUCTURES

(71) Applicant: NUtech Ventures, Lincoln, NE (US)

(72) Inventor: Lim Nguyen, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 384 days.

(21) Appl. No.: 17/103,210

(22) Filed: Nov. 24, 2020

(65) Prior Publication Data

US 2021/0161035 A1   May 27, 2021

Related U.S. Application Data

(60) Provisional application No. 62/940,599, filed on Nov. 26, 2019.

(51) Int. Cl.
*H05K 9/00* (2006.01)
*E04B 1/04* (2006.01)
(Continued)

(52) U.S. Cl.
CPC ............. *H05K 9/0003* (2013.01); *E04B 1/04* (2013.01); *E04B 1/92* (2013.01); *E04C 2/28* (2013.01); *E04C 2/526* (2013.01); *H05K 9/0086* (2013.01); *E04B 2001/0053* (2013.01); *E04B 2001/925* (2013.01); *E04B 2103/02* (2013.01)

(58) Field of Classification Search
CPC ........ E04B 1/0023; E04B 1/7038; E04B 2/58; E04B 2/60; E04B 1/04; E04B 1/92; E04B 2001/0053; E04B 2001/925; E04B 2103/02; E04C 3/07; E04C 2003/0443; E04C 2/28; E04C 2/526; E04F 19/04; E04F 19/0481;
(Continued)

(56) References Cited

U.S. PATENT DOCUMENTS 5,465,486 A    11/1995 King
5,580,319 A *  12/1996 Hamilton .............. A63F 7/0628
                                                      473/150
(Continued)

FOREIGN PATENT DOCUMENTS

CA    1288854 C  *  9/1991  ............... E04B 1/92
CN    101891419 A    11/2010
(Continued)

OTHER PUBLICATIONS

Mauriello, "Development of a Doorless Access Corridor for Shielded Facilities," *IEEE Transactions on Electromagnetic Compatibility*, 31(3): 223-229, (Aug. 1989).
(Continued)

*Primary Examiner* — Jessie T Fonseca
(74) *Attorney, Agent, or Firm* — Leydig, Voit & Mayer, Ltd.

(57) ABSTRACT

In an example, a conductive concrete structure disclosed. The conductive concrete can include a plurality of conductive side structures defining an interior of the conductive concrete structure and a plurality of conductive concrete partitions disposed within the interior of the conductive concrete structure. The plurality of conductive concrete partitions are arranged to define a labyrinth within the conductive concrete structure.

12 Claims, 9 Drawing Sheets

(51) Int. Cl.
*E04B 1/92* (2006.01)
*E04C 2/28* (2006.01)
*E04C 2/52* (2006.01)
*E04B 1/00* (2006.01)

(58) Field of Classification Search
CPC .. E04F 19/049; E04F 19/0495; H05K 9/0003; H05K 9/0086
See application file for complete search history.

(56) References Cited

U.S. PATENT DOCUMENTS

| | | | | |
|---|---|---|---|---|
| 6,821,336 | B1* | 11/2004 | Ramme | C04B 28/04 252/502 |
| 7,578,881 | B2* | 8/2009 | Ramme | C04B 28/04 106/713 |
| 8,968,461 | B1 | 3/2015 | Tuan et al. | |
| 9,278,887 | B1 | 3/2016 | Tuan et al. | |
| 9,681,593 | B2 | 6/2017 | Adachi et al. | |
| 10,034,418 | B1 | 7/2018 | Tuan et al. | |
| 10,256,006 | B1* | 4/2019 | Tuan | H01B 1/16 |
| 10,765,045 | B1 | 9/2020 | Hector | |
| 2003/0106455 | A1* | 6/2003 | Weston | A63G 7/00 104/53 |
| 2016/0234977 | A1* | 8/2016 | Tuan | B28B 23/02 |

FOREIGN PATENT DOCUMENTS

| | | | |
|---|---|---|---|
| CN | 109827999 A | * | 5/2019 |
| GB | 2510118 A | | 7/2014 |
| JP | 2017115376 A | * | 6/2017 |
| WO | WO 2018/232351 A1 | | 12/2018 |

OTHER PUBLICATIONS

Rodriguez, "On the Design of Door-Less Access Passages to Shielded Enclosures," *2017 Antenna Measurement Techniques Association Symposium (AMTA)*, IEEE, 6 pp. (2017).

European Patent Office, International Search Report in International Patent Application No. PCT/US2020/062033, 4 pp. (dated Mar. 1, 2021).

European Patent Office, Written Opinion in International Patent Application No. PCT/US2020/062033, 8 pp. (dated Mar. 1, 2021).

* cited by examiner

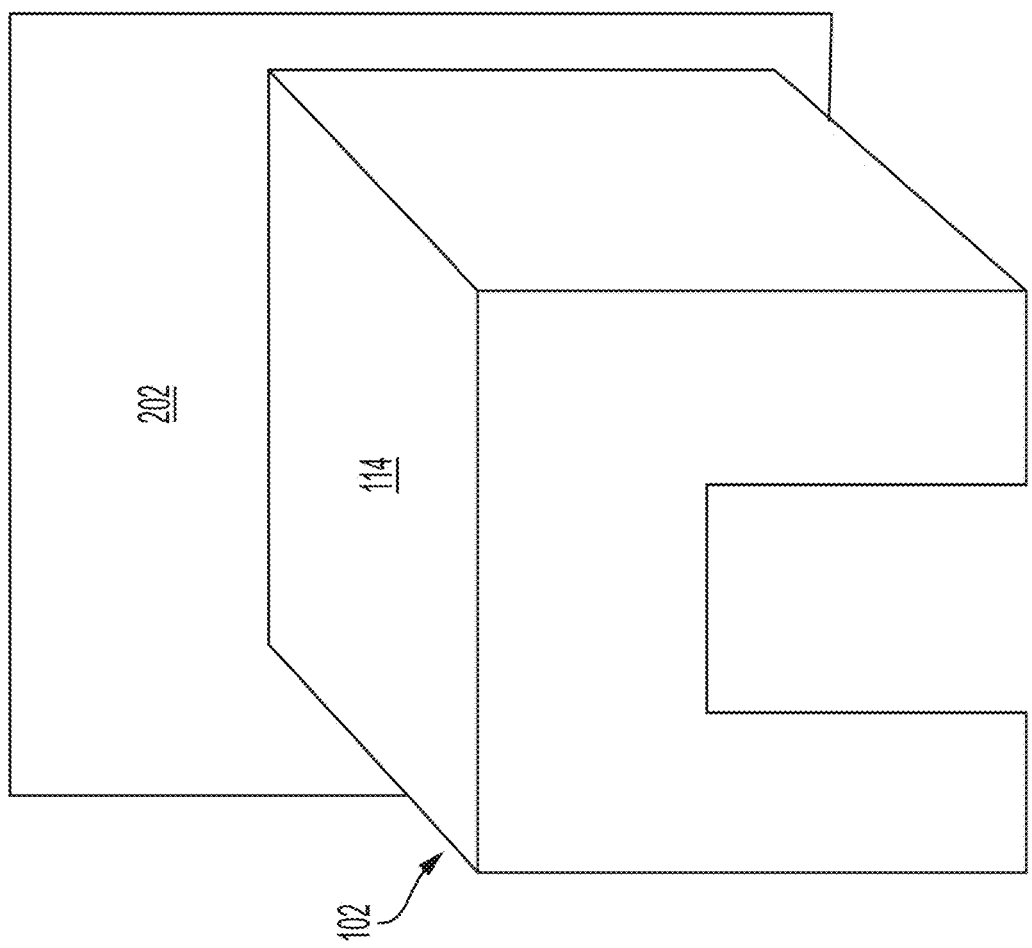
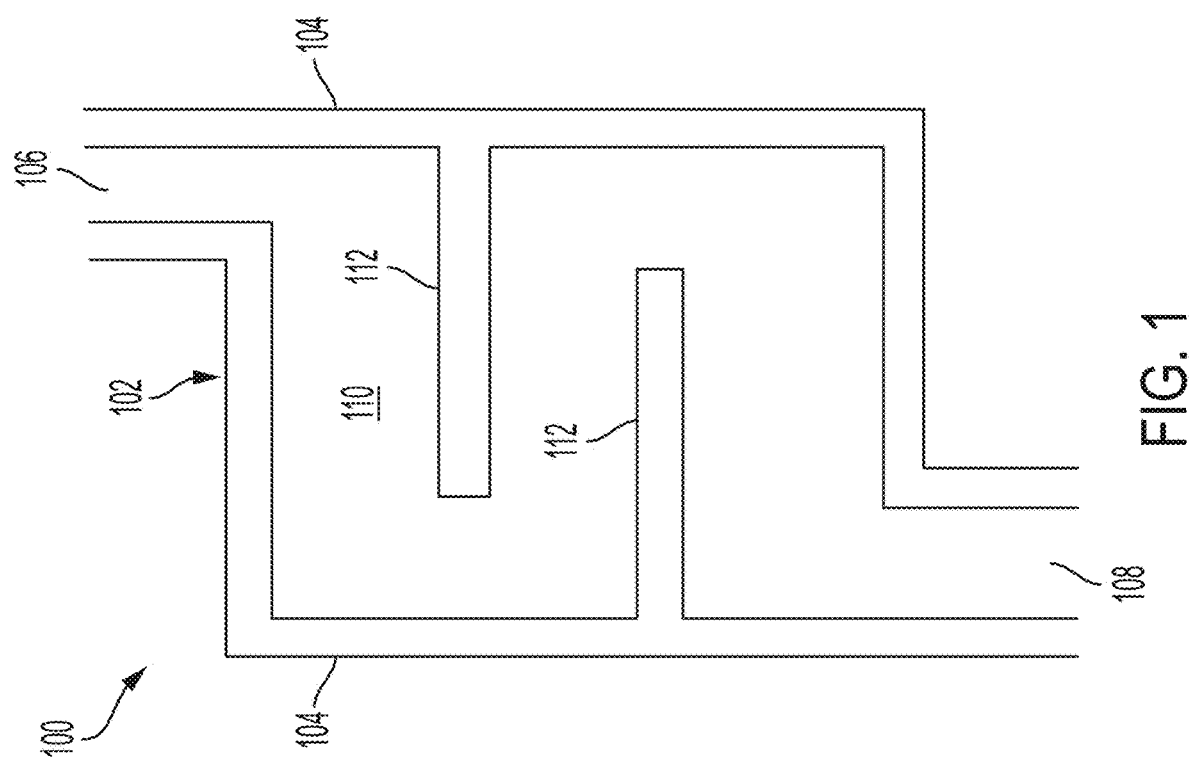

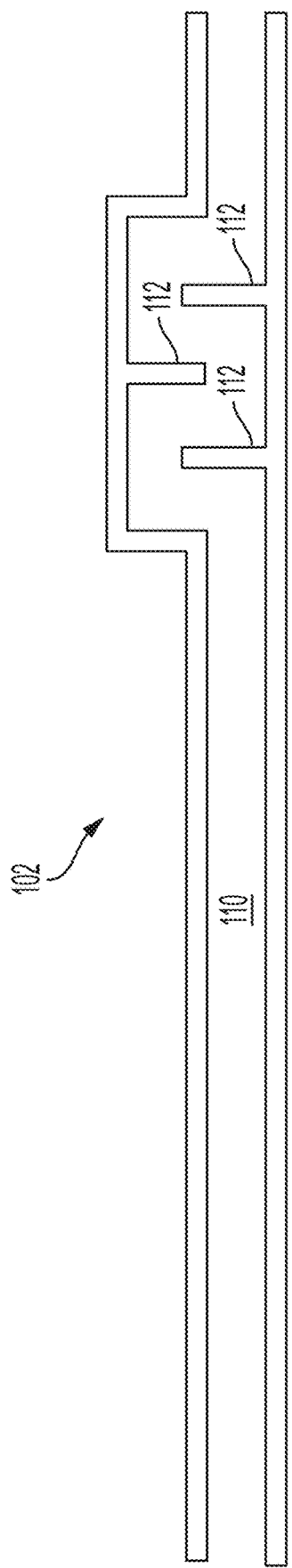
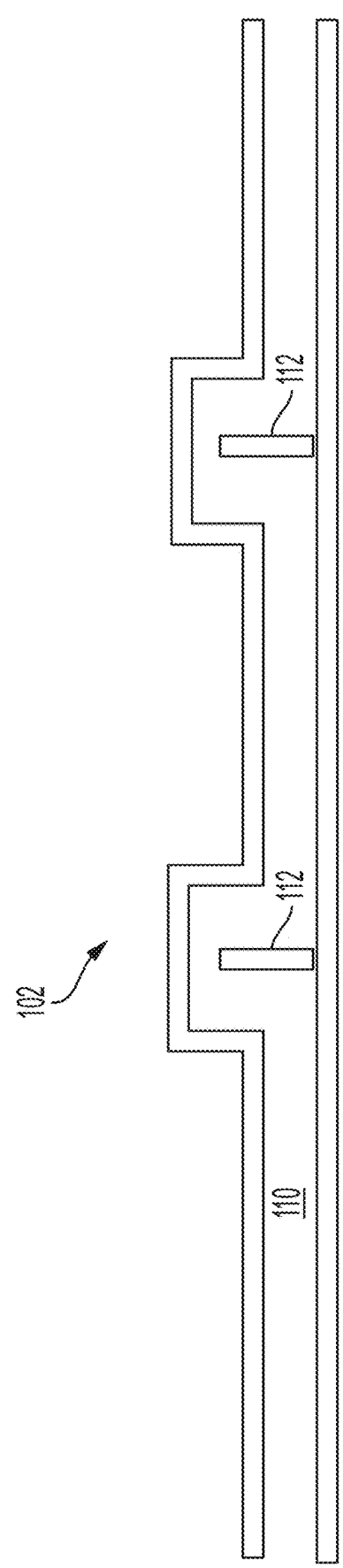

CONDUCTIVE CONCRETE STRUCTURE FOR DOORLESS ACCESS TO ELECTROMAGNETIC SHIELDED STRUCTURES

CROSS-REFERENCE TO RELATED APPLICATIONS

This patent application claims the benefit of U.S. Provisional Patent Application No. 62/940,599, filed Nov. 26, 2020, which is incorporated by reference in its entirety for all purposes.

BACKGROUND

Protection of electronic devices and electronic assets from electromagnetic (EM) threats is of continued importance. EM threats include lightning and solar storms, EM pulse (EMP) and electronic eavesdropping (TEMPEST). Typically, modern electronics operate at low voltage levels making them vulnerable to abrupt power surges. A sudden and intense EMP pulse—as fast as nanoseconds rise time and field strength as high as 50 kV/m—such as a high-altitude EMP (HEMP) event, could disable, damage, or destroy power grids, unprotected electrical devices, equipment, and controls for key services and infrastructures over a wide area. Lightning strikes, solar flares, or geomagnetic storms can produce similar catastrophic results. EMP can also be produced by high-powered, weaponized EM field generating devices.

Access to a shielded facility is typically provided via a radio frequency (RF) shielded door. As the door must remain closed in order to maintain the shielding integrity, a double-door vestibule is typically employed so that the timing of the doors opening and closing will ensure the shielding effectiveness of the facility as personnel traffic moves through the vestibule.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In an example, a conductive concrete structure disclosed. The conductive concrete can include a plurality of conductive side structures defining an interior of the conductive concrete structure and a plurality of conductive concrete partitions disposed within the interior of the conductive concrete structure. The plurality of conductive concrete partitions are arranged to define a labyrinth within the conductive concrete structure.

In other features, the plurality of conductive side structures define an ingress opening and an egress opening and the labyrinth comprises a passageway between the ingress opening and the egress opening.

In other features, a length of the passageway is at least six (6) times a largest dimension of a cross-section of the conductive concrete structure.

In other features, the ingress opening comprises a door.

In other features, the plurality of conductive side structures and the plurality of conductive concrete partitions comprise a plurality of conductive concrete slabs.

In other features, the plurality of conductive concrete slabs each comprise a precast conductive concrete slab.

In other features, each conductive concrete slab of the plurality of conductive concrete slabs is characterized by an electrical conductivity ranging between about 1 milli-siemens per meter (mS/m) to more than 10 siemens per meter (S/m).

In other features, each conductive concrete slab of the plurality of conductive concrete slabs is characterized by at least one of a return loss characteristic or a reflection characteristic ranging between less than about 1 decibel (dB) to more than about 40 dBs within the range of below 100 megahertz to above 10 gigahertz frequency range.

In other features, each conductive concrete slab of the plurality of conductive concrete slabs is characterized by at least one of an attenuation characteristic or an absorption characteristic ranging between less than 40 decibel (dB) to more than 100 dB within the below 100 megahertz to above 10 gigahertz frequency range.

In other features, the plurality of conductive concrete partitions are arranged to define a spiral labyrinth configuration therein.

In other features, the plurality of conductive concrete partitions are arranged to define a comb labyrinth configuration therein.

In other features, at least one conductive concrete partition of the plurality of conductive concrete partitions includes a conductive sheet or mesh.

In other features, the conductive sheet is disposed within the at least one conductive concrete partition.

In an example, a conductive concrete structure is disclosed. The conductive concrete structure includes a plurality of conductive side structures defining an interior of the conductive concrete structure and a plurality of conductive concrete partitions disposed within the interior of the conductive concrete structure. The plurality of conductive concrete partitions are arranged to define a passageway having at least one ninety degree turn in a first direction and at least one ninety degree turn in a second direction that is opposite the first direction.

In other features, the plurality of conductive side structures define an ingress opening and an egress opening and the passageway is disposed between the ingress opening and the egress opening.

In other features, the plurality of conductive side structures and the plurality of conductive concrete partitions comprise a plurality of conductive concrete slabs.

In other features, each conductive concrete slab of the plurality of conductive concrete slabs is characterized by an electrical conductivity ranging between about 1 milli-siemens per meter (mS/m) to more than 10 siemens per meter (S/m).

In other features, each conductive concrete slab of the plurality of conductive concrete slabs is characterized by at least one of a return loss characteristic or a reflection characteristic ranging between less than about 1 decibel (dB) to more than about 40 dBs within the below 100 megahertz to above 10 gigahertz frequency range.

In other features, each conductive concrete slab of the plurality of conductive concrete slabs is characterized by at least one of an attenuation characteristic or an absorption characteristic ranging between less than about 40 decibel (dB) to more than about 100 dBs within the below 100 megahertz to above 10 gigahertz frequency range.

In other features, at least one conductive concrete partition of the plurality of conductive concrete partitions includes a conductive sheet or mesh.

BRIEF DESCRIPTION OF THE DRAWINGS

The Detailed Description is described with reference to the accompanying figures. The use of the same reference numbers in different instances in the description and the figures may indicate similar or identical items.

FIG. 1 is a diagrammatical illustration of a conductive concrete structure according to an example implementation of the present disclosure.

FIG. 2 is an isometric illustration of the conductive concrete structure located adjacent to a shielded facility according to an example implementation of the present disclosure.

FIGS. 7A through 9B are plan views of a conductive concrete structure having various labyrinth configurations.

DETAILED DESCRIPTION

Figure 3:
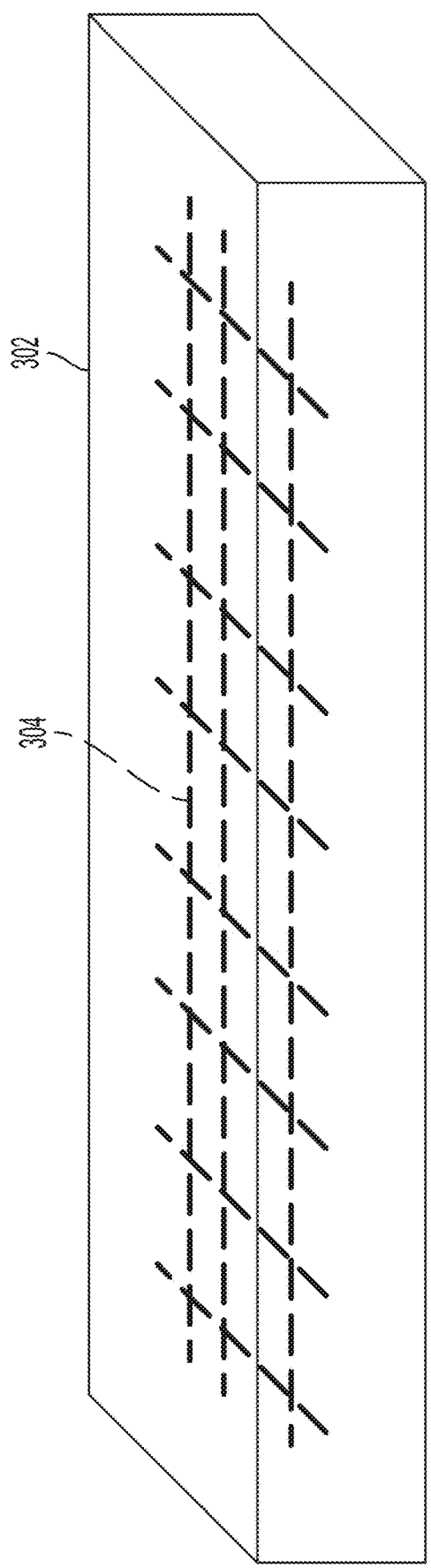
FIG. 3 is a diagrammatical illustration of a concrete structure used within the conductive concrete structure according to an example implementation of the present disclosure.
Figure 4A:
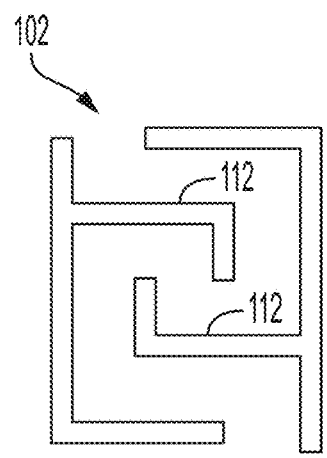
FIGS. 4A and 4B are plan views of a conductive concrete structure having a spiral labyrinth configuration.
Figure 4B:
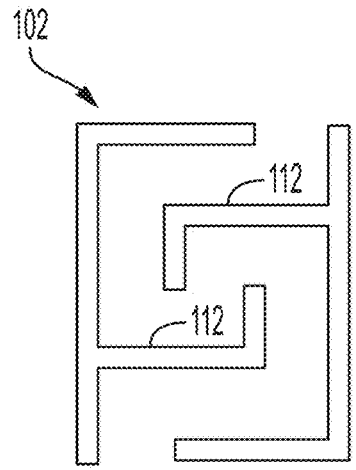
Figure 5A:
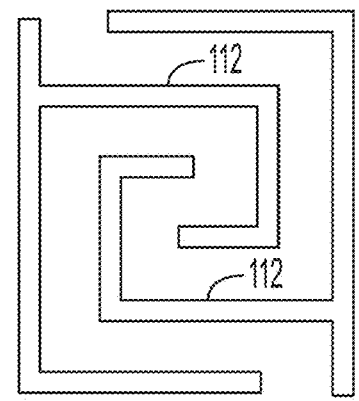
FIGS. 5A and 5B are plan views of a conductive concrete structure having a spiral labyrinth configuration.
Figure 5B:
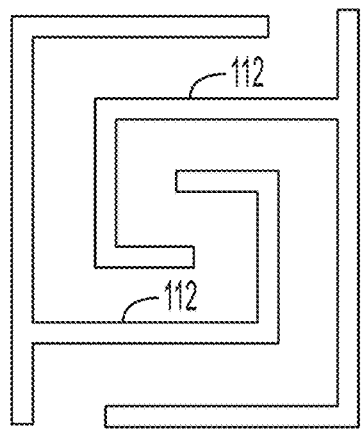
Figure 6A:
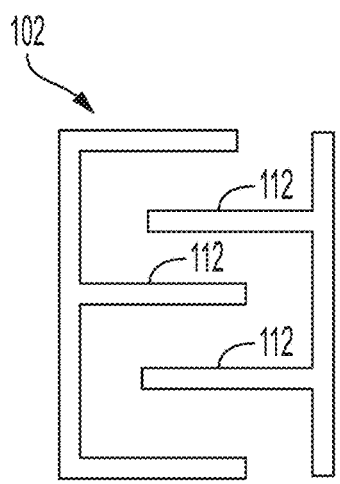
FIGS. 6A and 6B are plan views of a conductive concrete structure having a comb labyrinth configuration.
Figure 6B:
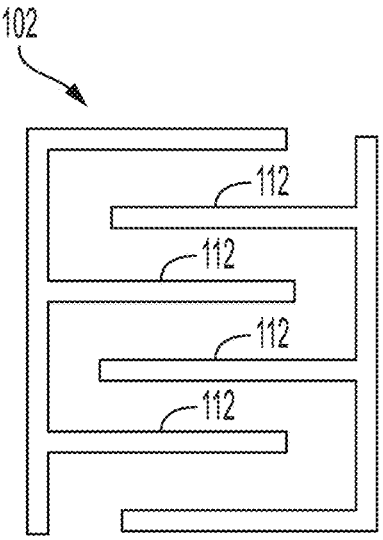
Figure 8B:
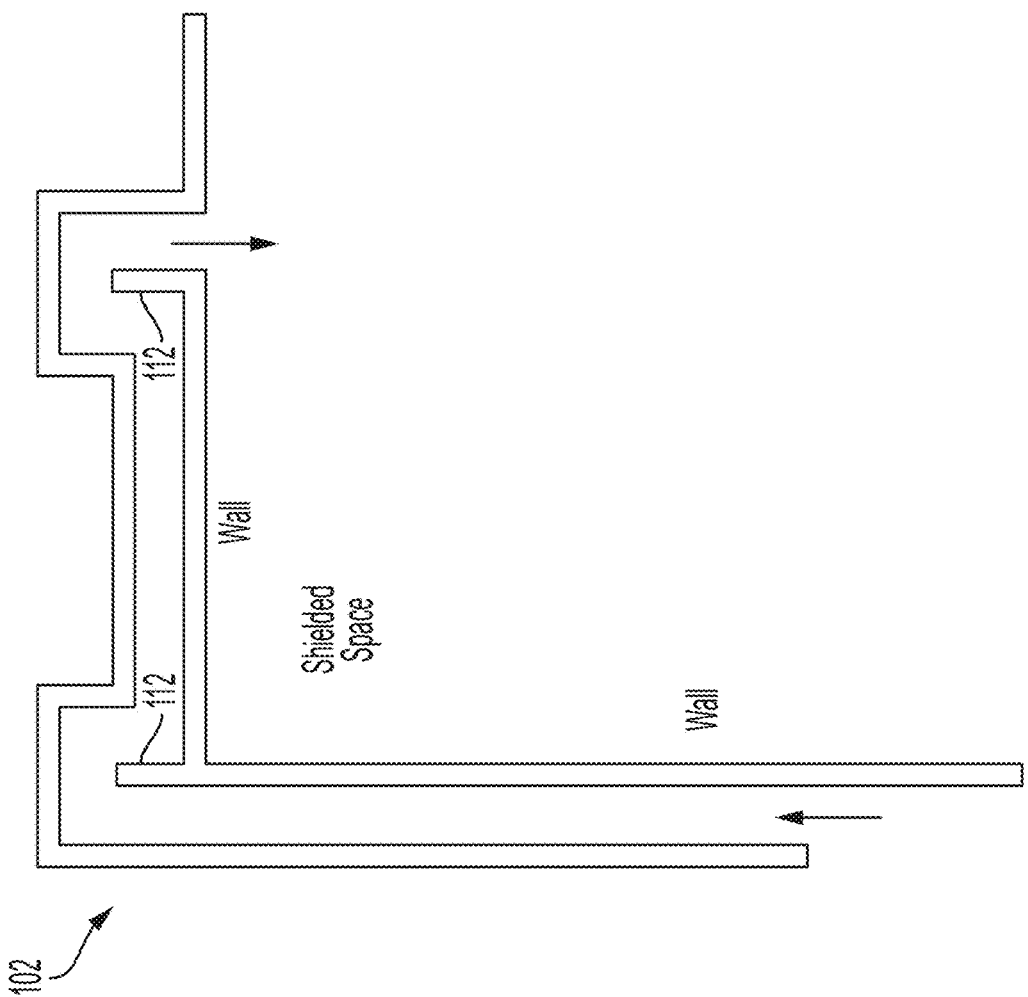
Figure 8A:
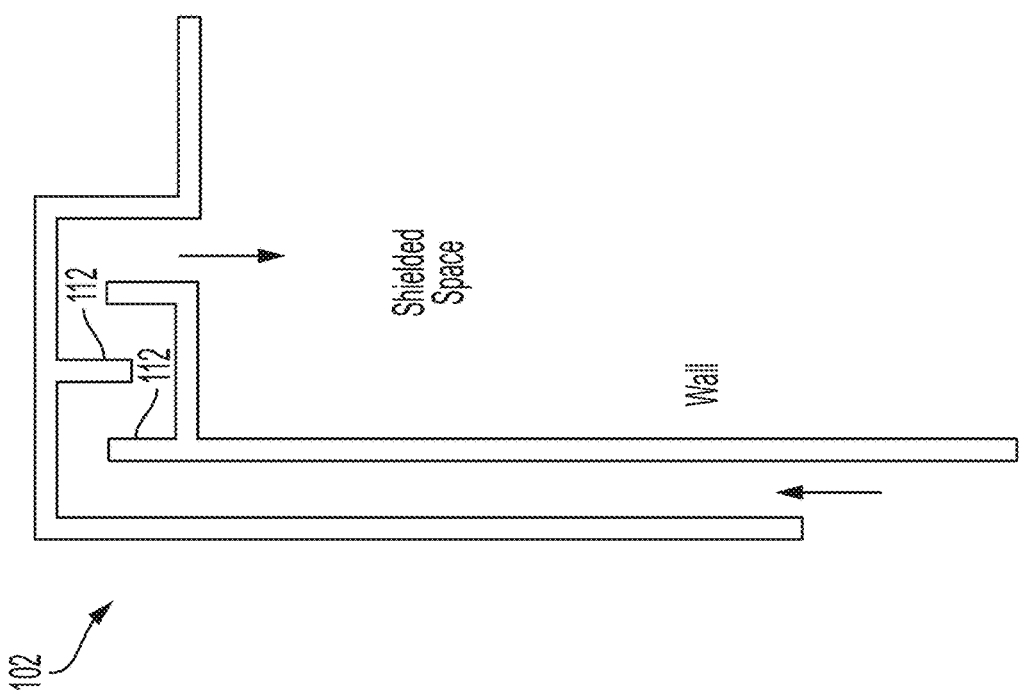
Figure 8C:
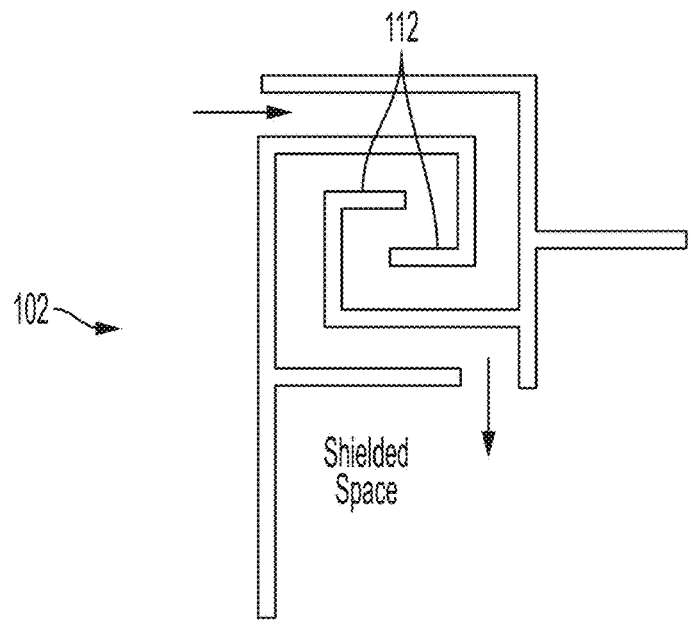
Figure 9A:
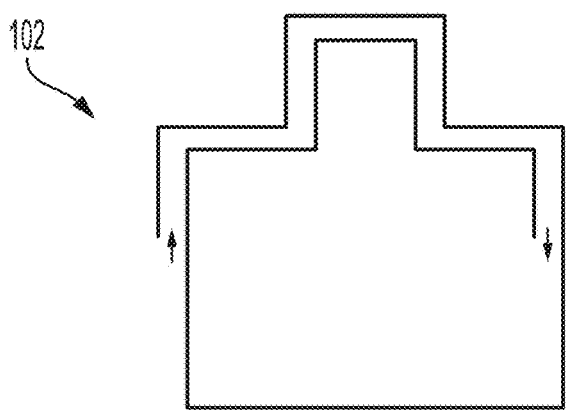
Figure 9B:
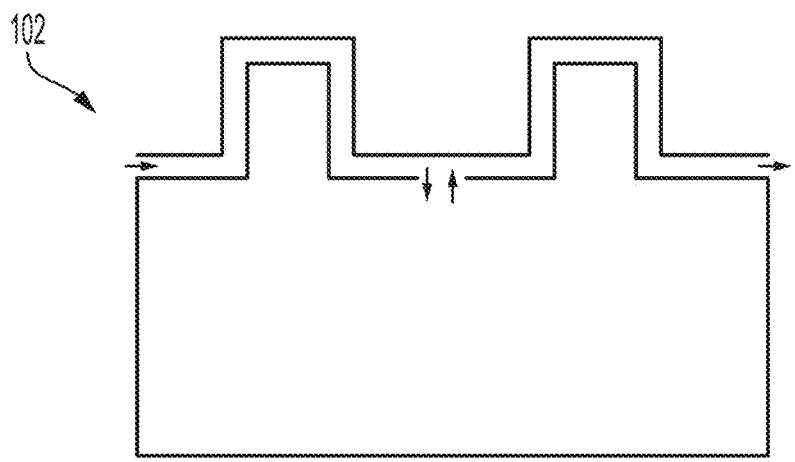
Figure 10A:
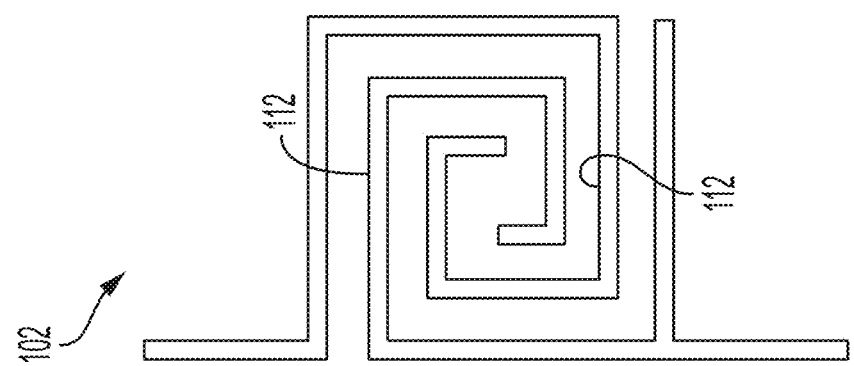
FIGS. 10A through 10D are plan views of conductive concrete structures having various spiral labyrinth configurations.
Figure 10B:
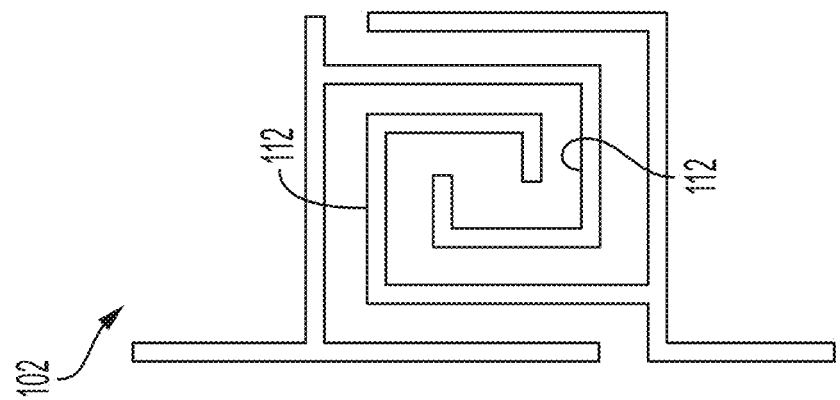
Figure 10C:
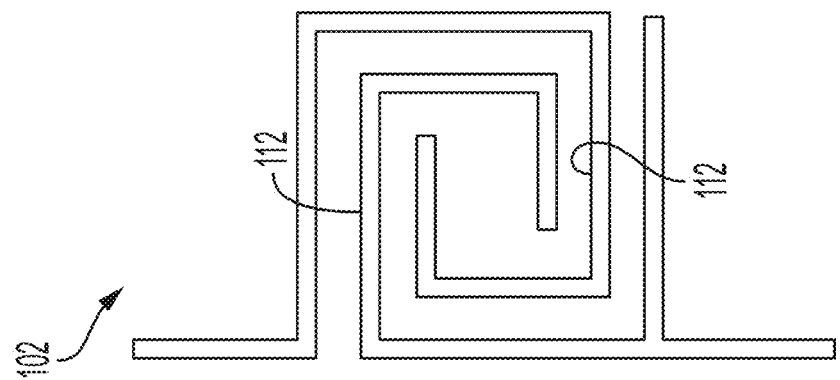
Figure 10D:
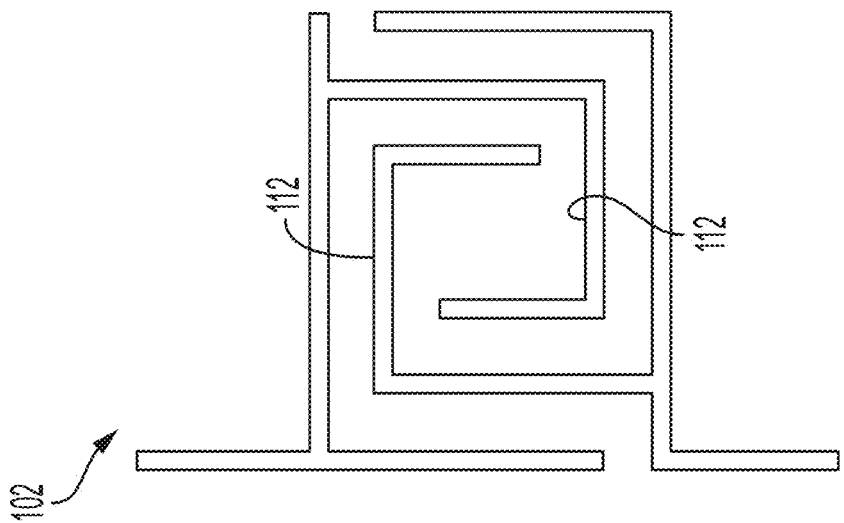

The present disclosure is directed to a conductive concrete structure that provides doorless access to one or more electromagnetic structures. The conductive concrete structure functions as a filter, such as an EMP filter, by using the absorption property of conductive concrete.

In general, use of shielded doors for accessing facilities becomes impractical in large shielded facilities with large volumes of daily traffic. The present disclosure describes an arrangement for shielded access passages or labyrinths to access shielded facilities that do not require use of doors, although doors can also be used for other purposes, for example, to limit or control access to the facility. The labyrinth employs welded metal panels that are covered with RF absorbers and the waveguide below cut-off (WBC) passage attenuates the low frequency electromagnetic (EM) waves. The RF absorbers lining the metal walls attenuates the propagating EM waves. The waveguide turns enhance high frequency attenuation at the absorber end walls.

The present disclosure generally describes the implementation of a labyrinth for door-less access based on conductive concrete for EM shielding. The structure operates as a lossy WBC so that propagating EM waves are absorbed by the conductive concrete medium and gradually attenuated along the labyrinth passage.

Facilities that employ two or more shielded doors may be impractical in a large facility that must accommodate a large volume of daily traffic. Therefore, shielded access passages or labyrinths have been developed that eliminate the shielded doors. As described herein, a conductive concrete structure can include one or more conductive concrete partitions such that a passageway includes one or more 180 degree turns that can enhance absorption and/or attenuation of electromagnetic (EM) waves.

FIGS. 1 and 2 illustrate an example implementation of a conductive concrete labyrinth structure 100. The conductive concrete labyrinth structure 100 includes a conductive concrete structure 102 having one or more conductive concrete side structures 104 that define exterior walls, e.g., exterior perimeter, of the conductive concrete structure 102 such that the conductive concrete side structures 104 define an interior space of the conductive concrete labyrinth structure 100. The conductive concrete structure 102 also defines a first opening 106, a second opening 108, and a passageway 110 therebetween. For instance, the labyrinth may comprise a single, non-branching passageway 110 between the first opening 106 and the second opening 108. The conductive concrete structure 102 can also include one or more conductive concrete partitions 112 disposed within the conductive concrete structure 102. The conductive concrete partitions 112 can, in part, define the passageway 110 between the first opening 106, e.g., ingress opening, and the second opening 108, e.g., egress opening. As shown in FIG. 2, the conductive concrete structure 102 also includes a top structure 114 that defines a roof for the conductive concrete structure 102, and also includes a floor surface to complete the structure. In an example implementation, the conductive concrete partitions 112 can extend from a ground surface to the top structure 114. It is understood that the conductive concrete structure 102 may be constructed from multiple conductive concrete slabs. For example, the conductive concrete side structures 104 and the conductive concrete partitions 112 may comprise conductive concrete slabs arranged in a predetermined configuration. In an example implementation, the conductive concrete slabs may be pre-cast and arranged in one or more configurations as discussed herein. As discussed herein, a conductive concrete slab may be a structural element including a substantially flat, horizontal surface made of cast conductive concrete.

The conductive concrete structure 102 can be located proximate to a secure facility, such as another conductive concrete structure 202 that houses sensitive electronic equipment. For example, the conductive concrete structure 202 may protect the electronic devices from energy generated by an EMP event. The conductive concrete structure 102 may be located adjacent to the conductive concrete structure 202 to provide doorless access to the conductive concrete structure 202. For example, personnel may gain access to the conductive concrete structure 202 via the conductive concrete structure 102. By providing doorless access to the conductive concrete structure 202, the conductive concrete structure 102 provides a secure environment such that personnel can enter the secure facility from an unsecure environment. It is understood that the conductive concrete structure 202 may or may not include a door.

The conductive concrete structure 102 includes a conductive concrete mixture that is configured to provide EMP shielding and reflect and/or absorb EM waves propagating through the conductive concrete mixture. The conductive concrete mixtures can include cement, water, conductive carbon material, magnetic material, and conductive metallic material. The conductive carbon material may include conductive carbon particles, conductive carbon powder, and/or coke breeze. The conductive metallic material may include steel fibers. The magnetic material may include taconite and/or iron silicate sand. The conductive concrete mixture may also include graphite powder, silica fume, and/or other supplementary cementitious materials (SCM) such as fly ash, calcined clay, and ground granular blast furnace slag (GGBFS).

In various implementations, the conductive concrete mixture may include one or more magnetic materials, such as a ferromagnetic material, a paramagnetic material, and so forth, which serve to provide EMP shielding and absorb EM waves propagating through the conductive concrete structure 102. For example, the conductive concrete mixture can include a taconite rock material that includes magnetite, such as a taconite aggregate. However, taconite aggregate is provided by way of example only and is not meant to limit the present disclosure. Thus, in other implementations, the conductive concrete mixture may include other materials, such as, but not limited to natural geological materials such as iron silicate sand, mineral materials, and so forth. For example, the conductive concrete mixture may include meteoric iron (e.g., iron from nickel-iron meteorites) having kamacite and/or taenite minerals. The conductive concrete mixture may also include magnetite crystals produced by bacteria and/or magnetite collected from river or beach sands. Further, the conductive concrete mixture may include titanohematite and/or pyrrhotite (which may be ground into a powder). In still further instances, the conductive concrete mixture may include a paramagnetic mineral, such as ilmenite, titanomagnetite, and so forth.

The conductive concrete mixture also includes one or more conductive materials configured to furnish electrical conductivity to the concrete. The conductive material serves to provide EMP shielding and reflect and absorb EM waves propagating through the conductive concrete mixture. For example, the conductive concrete mixture may include at least substantially uniformly distributed conductive materials, which may include metallic and possibly non-conductive metallic materials, such as metal and/or carbon fibers. In implementations, the conductive metallic material may serve to reflect EM waves, while the non-conductive metallic material may serve to absorb EM waves. For the purposes of the present disclosure, a conductive concrete mixture may be defined as a cement-based admixture containing electrically conductive components that furnish a relatively high electrical conductivity to the concrete (that is, with respect to the electrical conductivity of typical concrete).

The conductive concrete mixture may include conductive carbon particles, such as carbon powder, and so forth, which may furnish electrically conductive paths between portions of the conductive material, achieving, for instance, an effective reflective-wire-mesh structure in the concrete. In some implementations, graphite and carbon granules are used with the conductive concrete mixture.

FIG. 3 illustrates an example conductive concrete slab 302 of the conductive concrete structure 102 that includes a conductive sheet 304. The conductive sheet 304 may also be embodied as a conductive mesh 304, and in certain embodiments both a conductive sheet and/or conductive mesh may also be used in the same construction for a conductive concrete slab 302. The conductive concrete slab 302 comprise a wall, a roof, a portion of a wall, a portion of a roof, or the like of the conductive concrete structure 102 and may be formed using the conductive concrete mixture. In one or more implementations, the conductive sheet 304 may be disposed over an exterior surface of the conductive concrete slab 302. In other implementations, the conductive sheet 304 may be disposed within the conductive concrete slab 302. Additionally or alternatively, the conductive concrete slab 302 may include multiple conductive sheets 304. For example, a first conductive sheet 304 may be disposed over an external surface of the conductive concrete slab 302 and a second conductive sheet 304 may be disposed within the conductive concrete slab 302.

In some implementations, the conductive sheet 304 may comprise aluminum foil. In these implementations, the conductive sheet 304 have a thickness ranging from about 0.016 millimeters to about 0.024 millimeters.

In other implementations, the conductive sheet 304 may comprise a conductive screen or mesh. For example, one or more of the conductive screens may comprise a network, lattice, framework, and so forth of conductive material that defines multiple apertures (e.g., circular openings, elliptical openings, square openings, rectangular openings, hexagonal openings, octagonal openings, and so on). For instance, one or more of the conductive screens can be welded wire fabric (WWF), welded wire rebar (WWR), a fine metal screen, thin wire with a coarse screen, and/or various combinations thereof. For example, a conductive screen can comprise a woven wire mesh defining apertures each having a characteristic opening size of less than at least approximately two-tenths of an inch (0.2 in.). However, this mesh is provided by way of example only and is not meant to limit the present disclosure. In other embodiments, a conductive screen can comprise a mesh having a first group of elongated wires arranged proximate to one another across a second group of elongated wires, where the first elongated wires and the second elongated wires are directly fastened together (e.g., tied, welded) to define apertures each having a characteristic opening size of less than at least approximately three inches (3 in.). For example, light gauge wires, medium gauge wires, heavy gauge wires, rebar, and so forth can be welded together to form a mesh, where the openings between adjacent wires are from less than one-eighth inch (0.125 in.) by one-eighth inch (0.125 in.) one inch (1 in.) by one inch (1 in.), two inches (2 in.) by two inches (2 in.), three inches (3 in.) by three inches (3 in.), and so forth. Wires can include, but are not necessarily limited to: light gauge wires, medium gauge wires, heavy gauge wires, rebar, and so forth. For example, the conductive screen can be formed using one hundred and ninety-two one-thousandths of an inch (0.192 in.) diameter wire, one-eighth of an inch (⅛ in.) diameter wire, one-quarter inch (¼ in.) diameter rebar (e.g., #2 steel rebar), three-quarters of an inch (¾ in.) diameter rebar (e.g., #6 steel rebar), and so forth.

In various implementations, the electrical conductivity of the conductive concrete structure 102, e.g., each conductive concrete slab 302, can range from about 1 milli-siemens per meter (mS/m) to about 10 siemens per meter (S/m). For instance, the conductive concrete slabs may have an electrical conductivity ranging between from about 1 milli-siemens per meter (mS/m) to more than 10 siemens per meter (S/m). Conductivity may be calculated as simply the inverse of resistivity. Electrical resistivity or conductivity may be measured using a two-point uniaxial method or a four-point (Wenner probe) method. As an example, resistivity may be measured according to American Association of State Highway and Transportation Officials (AASHTO) Test Procedure (TP) 95.

In various implementations, the return loss characteristics and/or reflection characteristics of the conductive concrete slab 302 may range from less than about 1 decibel (dB) to more than about 40 dBs within the below 100 megahertz to above 10 gigahertz frequency range. The attenuation characteristics and/or absorption characteristics of the conductive concrete slab 302 may range from less than about 40 dBs to more than about 100 dBs within the less than 100 megahertz to more than 10 gigahertz frequency range.

The conductive concrete partitions 112 can be arranged within the conductive concrete structure 102 to form a labyrinth therein. Within the present context, the conductive concrete partitions 112 are arranged such that passageway 110 includes multiple pathways. For example, the passageway 110 can comprise a series of turns that enhance absorption and/or improve attenuation of the conductive concrete structure 102. In some implementations, a length of the passageway 110 as measured from the first opening 106 to the second opening 108 may be at least six (6) times the largest dimension of the cross-section. For example, a 6-ft× 8-ft passage may need a 48-ft passageway 110. Of course, it is contemplated that a shorter passageway 110 will also provide at least some protection from EMP.

FIGS. 4A through 10D illustrate example plan views of various conductive concrete partition 112 arrangements. For example, FIGS. 4A through 5B illustrate the conductive concrete partitions 112 arranged in a spiral configuration. For example, the conductive concrete partitions 112 may be arranged such that the passageway 110 includes a series of turns in one direction before a series of turns in the other direction. In an example implementation, the conductive concrete partitions 112 may be arranged such that the passageway 112 defines a series of ninety degree (90°) turns in one direction and then a series of ninety degree (90°) turns in an opposite direction. FIGS. 6A and 6B illustrate the conductive concrete partitions arranged in a comb configuration in which the passageway 110 comprises a series of one hundred and eighty degree (180°) degree turns.

FIGS. 7A and 7B illustrate another implementation of the conductive concrete structure 102. As shown, the conductive concrete partitions 112 may be arranged such that the conductive concrete structure 102 includes an extended linear passageway 110 having one or more comb configurations. FIGS. 8A through 9B illustrate additional implementations of the conductive concrete structure 102. FIGS. 10A through 10D illustrate additional implementations of the spiral configuration.

In some implementations, the conductive concrete structure 102 may employ a shielded revolving door for additional EM attenuation. In some examples, the door may include shielded glass on the rotating sections. The door may also employ capacitive coupling between the rotating and stationary surfaces of the revolving door to control the RF leakage. Additionally, the wall surfaces may employ a rough finish to enhance EM absorption.

Figure 11A:
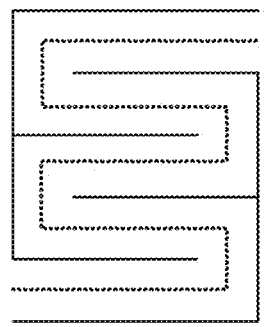
FIGS. 11A and 11B plan views illustrating an example path through a conductive concrete structure arranged in a comb labyrinth configuration and an example electromagnetic wave that is reflected and/or absorbed by interacting with the conductive concrete structure.
Figure 11B:
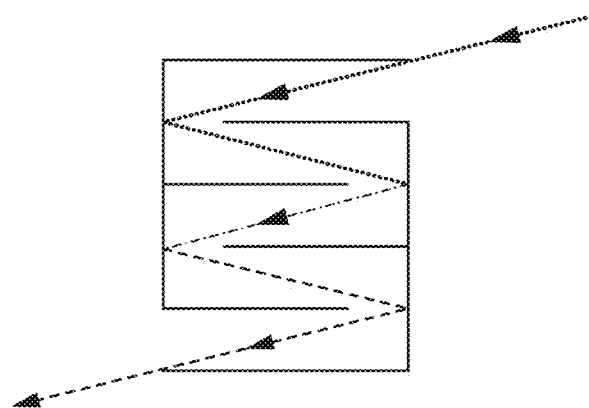
Figure 12A:
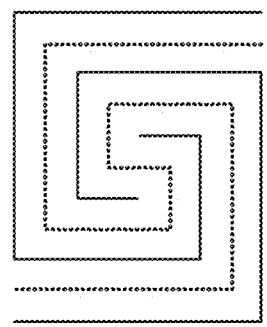
FIGS. 12A and 12B are plan views illustrating an example path through a conductive concrete structure arranged in a spiral labyrinth configuration and an example electromagnetic wave that is reflected and/or absorbed by interacting with the conductive concrete structure.
Figure 12B:
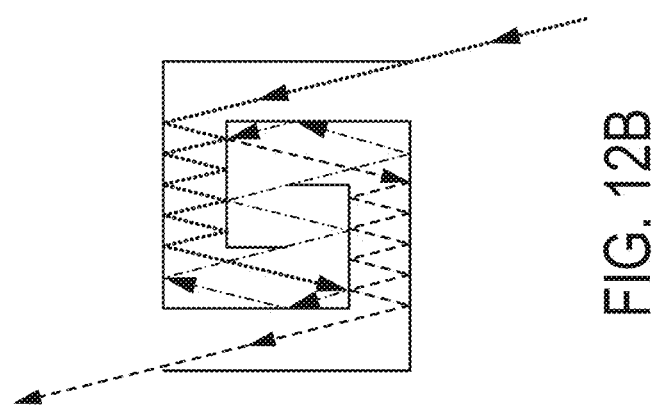

FIGS. 11A and 11B illustrate the conductive concrete structure 102 having concrete partitions 112 arranged in a comb configuration. FIG. 11A illustrates an example travel path, and FIG. 11B illustrates an example EM wave that is reflected and/or absorbed by interacting with the conductive concrete structure 102. FIGS. 12A and 12B illustrate the conductive concrete structure 102 having concrete partitions 112 arranged in a spiral configuration. FIG. 12A illustrates an example travel path, and FIG. 12B illustrates an example EM wave that is reflected and/or absorbed by interacting with the conductive concrete structure 102. As shown, an EM wave may be subject to additional reflection and/or absorption when the conductive concrete partitions are arranged in the spiral configuration.

Figure 13:
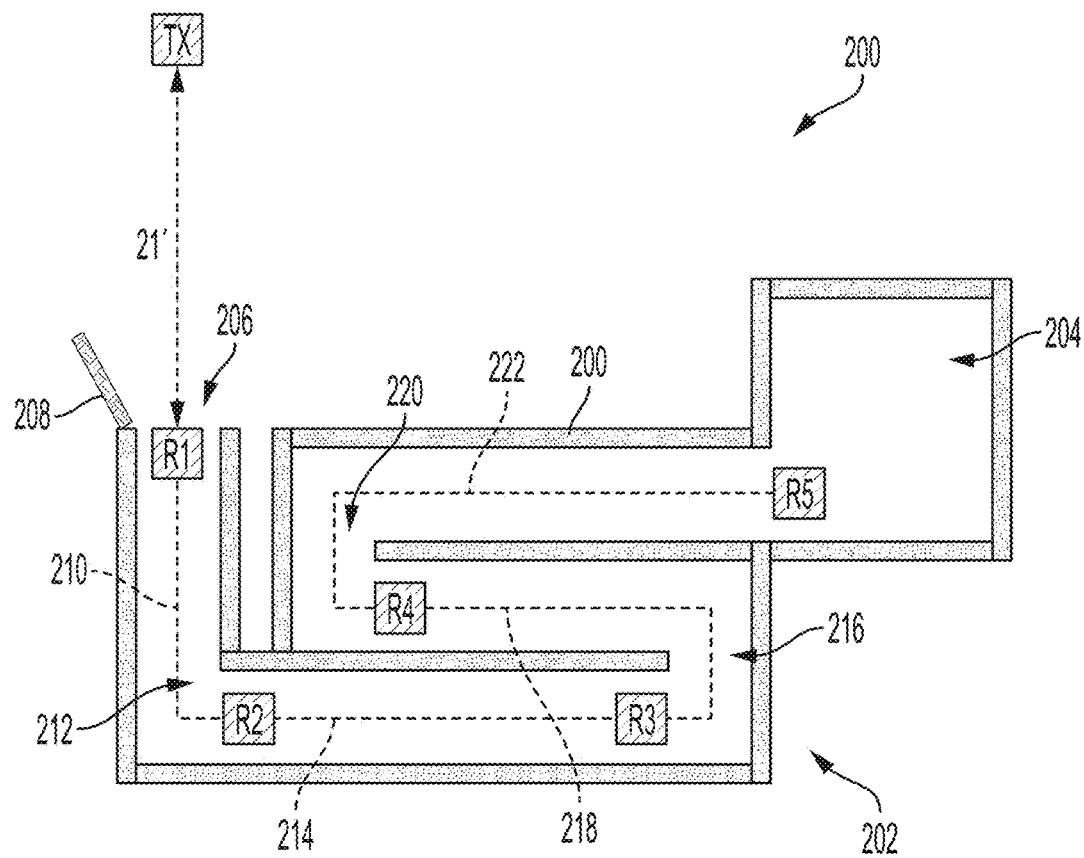
FIG. 13 is a plan view of an exemplary conductive concrete structure arranged in a labyrinth configuration between a door opening and a shielded room and having one or more conductive concrete partition arrangements according to an example implementation of the present disclosure.

One exemplary layout for a structure 200 that includes a concrete labyrinth 202 disposed to provide access to a shielded room 204 through an ingress/egress opening 206 is shown in FIG. 13. In this example, the labyrinth 202 includes one 90 degree turn and two 180 degree turns. More specifically, access through the opening 206, which can also include an optional door 208, includes travel along a first section 210 having a length of about 15 feet. A first turn 212, which in this example is a 90 degree left turn in the described direction of travel, separates the first section 210 from a second section 214, which in the illustrated example is 35 feet long. At the end of the second section 214 is a second turn 216, which in this example, is a 180 degree turn to the left in the direction of travel towards the room 204.

The second turn 216 separates the second section 214 from a third section 218, which in the illustrated example, is 22 feet long. At the end of the third section 218 is a third turn 220, which in the illustrated example is a 180 degree turn to the right in the direction of travel. The third turn 220 separates the third section 218 from a fourth section 222, which in the illustrated example is 25 feet long and leads directly into the lower left corner and is open to the room 204.

In the structure 200, the corridor passage along the labyrinth 202 is approximately 97 feet long in total and terminates in the room 204, which is dimensioned as a 12 foot by 12 foot square plan room. The labyrinth 202 is cast with 10 inch thick conductive concrete and embedded wire mesh forming a cross section of 4 ft. width by 7 ft. height. The cross section dimensions in meters yield cut-off frequencies of 300/2 W=123.0 MHz and 300/2H=70.3 MHz for vertical and horizontal polarizations, respectively.

For testing the attenuation of the structure 200, the labyrinth attenuation was measured with a Keysight E5080A vector network analyzer (VNA). Two radio over fiber optic links connected the downlink power amplifier inputs and the uplink receive antenna outputs respectively to VNA ports 1 and 2. The power amplifiers were Amplifier Research 50U1000 at 50 W (10 kHz to 1 GHz) and HD Communications HD31122 at 4 W (1 GHz to 20 GHz). The test antennas were ETS-Lindgren 6512 loop (10 kHz to 20 MHz), Comp-Power AC-220 combilog (20 MHz to 1 GHz) and AH-118 horn (1 GHz to 9 GHz). The transmit antennas were bore sighted to the labyrinth entrance at 21 ft. distance as shown by the measurement set up in FIG. 13, which is described below.

More specifically, the transmit antennas denoted by "TX" in FIG. 13 were bore sighted directly to the opening 206 with the door 208 open and at a distance of 21 feet from the door sill. A plurality of receive antennas denoted as R1, R2, R3, R4, and R5 were placed or spotted along the labyrinth 202 in the locations shown in FIG. 13. More specifically, antenna R1 was placed at the ingress/egress or door opening 206, R2 was placed after the first turn 212, R3 was placed before the second turn 216, R4 was placed before the third turn 220, and R5 was placed at the opening between the labyrinth 202 and the room 204.

Figure 14:
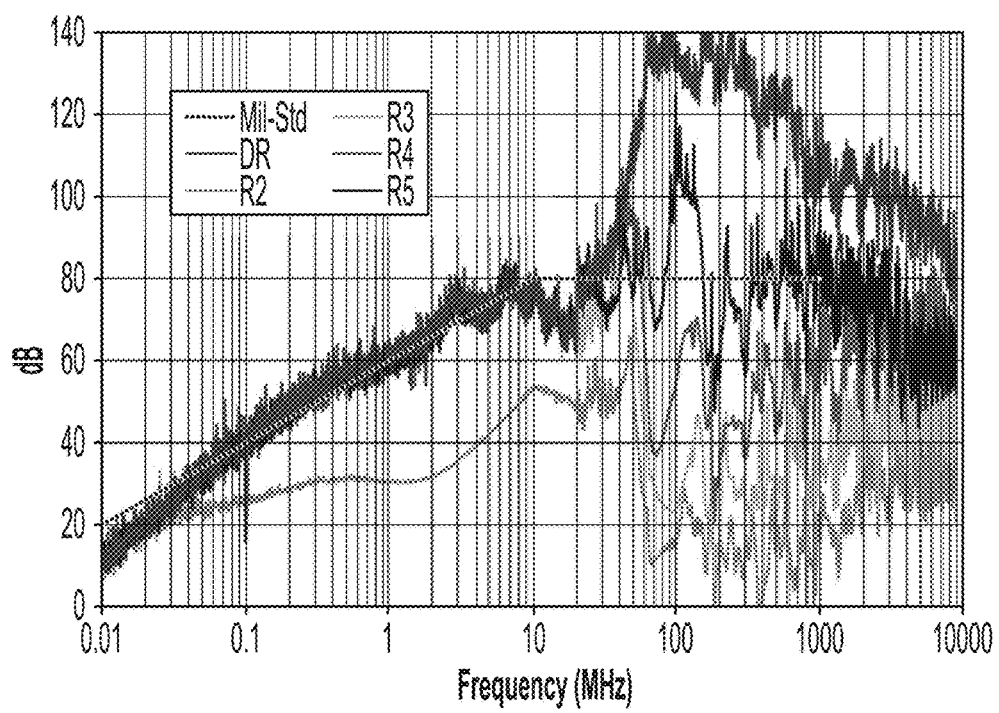
FIG. 14 is a graphical representation or plot of relative attenuation of the labyrinth of FIG. 13 in accordance with the disclosure.

The plot of FIG. 14 illustrates the attenuation measured in the structure 200. More specifically, FIG. 14 plots the relative attenuation of the labyrinth at positions R2 to R5. The attenuation was determined relative to the entrance position by subtracting the receive signal strengths in dB at positions R2 to R5 to that from the entrance R1. The transmit distance was constrained physically to 21 ft. or about 1.5 wavelength at 70 MHz that approximated the far field radiating condition above the waveguide cut-off frequencies as can be seen around 70 MHz and 125 MHz in FIG. 14. The results were limited by the measurement dynamic range (DR) below 20 MHz.

The plot of FIG. 14 demonstrates that the conductive concrete labyrinth 202 performs as a lossy WBC and attenuates the propagating EM waves as expected. The attenuation approaches Mil-Std 188-125-1 limit of 80 dB and averages about 15-20 dB per turn.

"About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A. The term subset does not necessarily require a proper subset. In other words, a first subset of a first set may be coextensive with (equal to) the first set.

What is claimed is:

1. A conductive concrete structure comprising:
a plurality of conductive concrete exterior walls defining an interior of the conductive concrete structure; and
a plurality of conductive concrete interior walls disposed within the interior of the conductive concrete structure that at least partially separate a first interior area from a second interior area;
a conductive concrete roof spanning at least a portion of the interior of the conductive concrete structure,
wherein the plurality of conductive concrete interior walls are arranged to define a door-less, conductive concrete labyrinth therein,
wherein a first conductive concrete interior wall of the plurality of conductive concrete interior walls is adjacent to and disposed perpendicular to a second conductive concrete interior walls of the plurality of conductive concrete interior walls,
wherein the plurality of conductive concrete exterior walls and the plurality of conductive concrete interior walls comprise a plurality of conductive concrete slabs,
wherein each conductive concrete slab of the plurality of conductive concrete slabs is characterized by an electrical conductivity ranging between about 1 milli-siemens per meter (mS/m) to 10 siemens per meter (S/m), and
wherein each conductive concrete slab of the plurality of conductive concrete slabs is characterized by at least one of a return loss characteristic or a reflection characteristic ranging between about 1 decibel (dB) to about 40 dBs within the 100 megahertz to 10 gigahertz frequency range.

2. The conductive concrete structure as recited in claim 1, wherein a length of the passageway is at least six times a largest dimension of a cross-section of the conductive concrete structure.

3. The conductive concrete structure as recited in claim 1, wherein the ingress and egress opening comprises a door.

4. The conductive concrete structure as recited in claim 1, wherein the plurality of conductive concrete slabs each comprises a precast conductive concrete slab.

5. The conductive concrete structure as recited in claim 1, wherein each conductive concrete slab of the plurality of conductive concrete slabs is characterized by at least one of an attenuation characteristic or an absorption characteristic ranging between less than about 40 decibel (dB) to more than about 100 dBs within the less than 100 megahertz to more than 10 gigahertz frequency range.

6. The conductive concrete structure as recited in claim 1, wherein the plurality of conductive concrete interior walls are arranged to define a spiral labyrinth configuration therein.

7. The conductive concrete structure as recited in claim 1, wherein the plurality of conductive concrete interior walls are arranged to define a comb labyrinth configuration therein.

8. The conductive concrete structure as recited in claim 1, wherein at least one conductive concrete interior wall of the plurality of conductive concrete interior walls includes a conductive sheet or mesh.

9. The conductive concrete structure as recited in claim 8, wherein the conductive sheet or mesh is disposed within the at least one conductive concrete interior wall.

10. A conductive concrete structure comprising:
a plurality of conductive concrete exterior walls defining an interior of the conductive concrete structure; and
a plurality of conductive concrete interior walls disposed within the interior of the conductive concrete structure,
a conductive concrete roof spanning at least a portion of the interior of the conductive concrete structure,
wherein the plurality of conductive concrete interior walls are arranged to define a door-less labyrinth with a passageway between an ingress opening and an egress opening, the passageway having at least one ninety degree turn in a first direction and at least one ninety degree turn in a second direction that is opposite the first direction,
wherein the plurality of conductive concrete exterior walls and the plurality of conductive concrete interior walls comprise a plurality of conductive concrete slabs,
wherein each conductive concrete slab of the plurality of conductive concrete slabs is characterized by an electrical conductivity ranging between about 1 milli-siemens per meter (mS/m) to 10 siemens per meter (S/m), and
wherein each conductive concrete slab of the plurality of conductive concrete slabs is characterized by at least one of a return loss characteristic or a reflection characteristic ranging between about 1 decibel (dB) to about 40 dBs within the 100 megahertz to 10 gigahertz frequency range.

11. The conductive concrete structure as recited in claim 10, wherein each conductive concrete slab of the plurality of conductive concrete slabs is characterized by at least one of an attenuation characteristic or an absorption characteristic ranging between less than 40 decibel (dB) to more than 100 dBs from below 100 megahertz to above 10 gigahertz frequency range.

12. The conductive concrete structure as recited in claim 10, wherein at least one conductive concrete interior wall of the plurality of conductive concrete interior walls includes a conductive sheet or mesh.

* * * * *